(12) United States Patent
Okuzono et al.

(10) Patent No.: US 11,889,713 B2
(45) Date of Patent: Jan. 30, 2024

(54) DISPLAY DEVICE AND ELECTRONIC APPARATUS INCLUDING SEAL PART OUTSIDE RECESS

(71) Applicant: Sony Semiconductor Solutions Corporation, Kanagawa (JP)

(72) Inventors: Shinya Okuzono, Kumamoto (JP); Hidetoshi Haraguchi, Kumamoto (JP); Ichiro Fujimoto, Kumamoto (JP); Naoki Nagasako, Kumamoto (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 313 days.

(21) Appl. No.: 17/280,281

(22) PCT Filed: Aug. 30, 2019

(86) PCT No.: PCT/JP2019/034171
§ 371 (c)(1),
(2) Date: Mar. 26, 2021

(87) PCT Pub. No.: WO2020/071026
PCT Pub. Date: Apr. 9, 2020

(65) Prior Publication Data
US 2021/0343978 A1    Nov. 4, 2021

(30) Foreign Application Priority Data
Oct. 2, 2018   (JP) .................. 2018-187281

(51) Int. Cl.
*H10K 59/12* (2023.01)
*H10K 50/84* (2023.01)
(Continued)

(52) U.S. Cl.
CPC ....... *H10K 50/8426* (2023.02); *H10K 59/121* (2023.02); *G02F 1/133512* (2013.01);
(Continued)

(58) Field of Classification Search
CPC ............. H10K 50/8426; H10K 50/841; H10K 50/8428; H10K 50/544; H10K 59/121;
(Continued)

(56) References Cited

U.S. PATENT DOCUMENTS 5,239,228 A     8/1993  Taniguchi et al.
6,784,612 B2 *  8/2004  Park ..................... H10K 50/846
                                                      313/504
(Continued)

FOREIGN PATENT DOCUMENTS

JP         04-71190 A       3/1992
JP      2004227792 A  *     8/2004
(Continued)

OTHER PUBLICATIONS

International Search Report (PCT/ISA/210), International Application No. PCT/JP2019/034171, dated Nov. 6, 2019.
(Continued)

*Primary Examiner* — Ida M Soward
(74) *Attorney, Agent, or Firm* — Michael Best & Friedrich LLP

(57) ABSTRACT

A display device of the present disclosure includes a first substrate on which light-emitting units are formed, a second substrate disposed to face the first substrate, and a seal part which bonds the first substrate and the second substrate. In addition, at least one of the first substrate and the second substrate includes a recess formed at a portion outside an area of the light-emitting units, and the seal part is formed outside the recess. Further, an electronic apparatus of the present disclosure has the display device having the aforementioned configuration.

20 Claims, 16 Drawing Sheets

(51) Int. Cl.
*G02F 1/13* (2006.01)
*H10K 50/842* (2023.01)
*H10K 59/121* (2023.01)
*H10K 59/123* (2023.01)
*H10K 59/126* (2023.01)
*G02F 1/1335* (2006.01)
*H10K 50/844* (2023.01)
*G02F 1/1362* (2006.01)

(52) U.S. Cl.
CPC .. *G02F 1/133514* (2013.01); *G02F 1/136209* (2013.01); *G09G 2300/0408* (2013.01); *H10K 50/844* (2023.02); *H10K 50/8428* (2023.02); *H10K 59/123* (2023.02); *H10K 59/126* (2023.02); *H10K 59/1216* (2023.02)

(58) Field of Classification Search
CPC ............. H10K 59/127; H10K 59/1216; H10K 59/123; H10K 59/126; H10K 77/10; G02F 1/133512; G02F 1/133514
See application file for complete search history.

(56) References Cited

U.S. PATENT DOCUMENTS

| | | | | |
|---|---|---|---|---|
| 6,825,612 | B2* | 11/2004 | Lai | H10K 50/841 313/504 |
| 8,125,146 | B2* | 2/2012 | Park | H10K 50/841 313/512 |
| 8,310,154 | B2* | 11/2012 | Allemand | B81C 1/00285 313/506 |
| 8,736,163 | B2* | 5/2014 | Kim | H10K 59/127 445/25 |
| 9,660,222 | B2* | 5/2017 | Ikeda | H10K 50/87 |
| 2002/0155320 | A1* | 10/2002 | Park | H10K 50/844 428/917 |
| 2005/0140284 | A1* | 6/2005 | Im | H10K 50/171 313/506 |
| 2006/0001041 | A1* | 1/2006 | Peng | H10K 50/841 257/99 |
| 2007/0013292 | A1* | 1/2007 | Inoue | H05B 33/04 313/504 |
| 2007/0170849 | A1 | 7/2007 | Park | |
| 2009/0066243 | A1* | 3/2009 | Sakurai | H10K 50/841 313/512 |
| 2010/0308720 | A1* | 12/2010 | Lee | H10K 59/87 430/323 |
| 2011/0012506 | A1* | 1/2011 | Seo | H10K 50/846 313/504 |
| 2012/0286655 | A1* | 11/2012 | Seo | H10K 50/846 313/504 |

FOREIGN PATENT DOCUMENTS

| | | | | |
|---|---|---|---|---|
| JP | 2005-294057 | A | | 10/2005 |
| JP | 2007-066598 | A | | 3/2007 |
| JP | 2007066598 | A | * | 3/2007 |
| JP | 2007-200884 | A | | 8/2007 |
| JP | 2008288031 | A | * | 11/2008 |
| WO | WO-2010023758 | A1 | * | 3/2010 ......... H01L 51/5237 |

OTHER PUBLICATIONS

Notification of Transmittal of the International Search Report and the Written Opinion of the International Searching Authority, or the Declaration (PCT/ISA/220), International Application No. PCT/JP2019/034171, dated Nov. 19, 2019.

Written Opinion of the International Search Authority (PCT/ISA/237), International Application No. PCT/JP2019/034171, dated Nov. 19, 2019.

* cited by examiner

Fig. 4
Fig. 4A
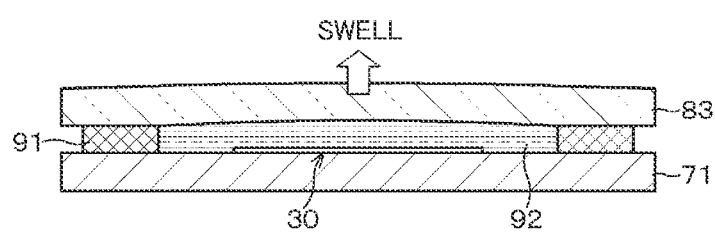
Fig. 4B
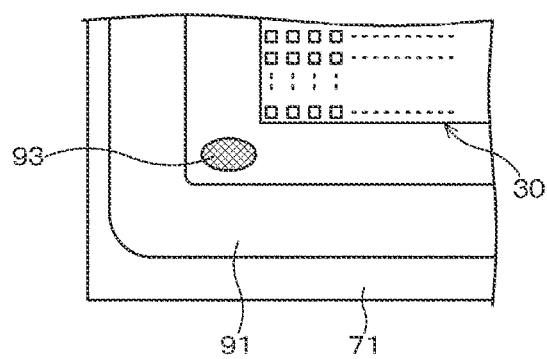

Fig. 5
Fig. 5A
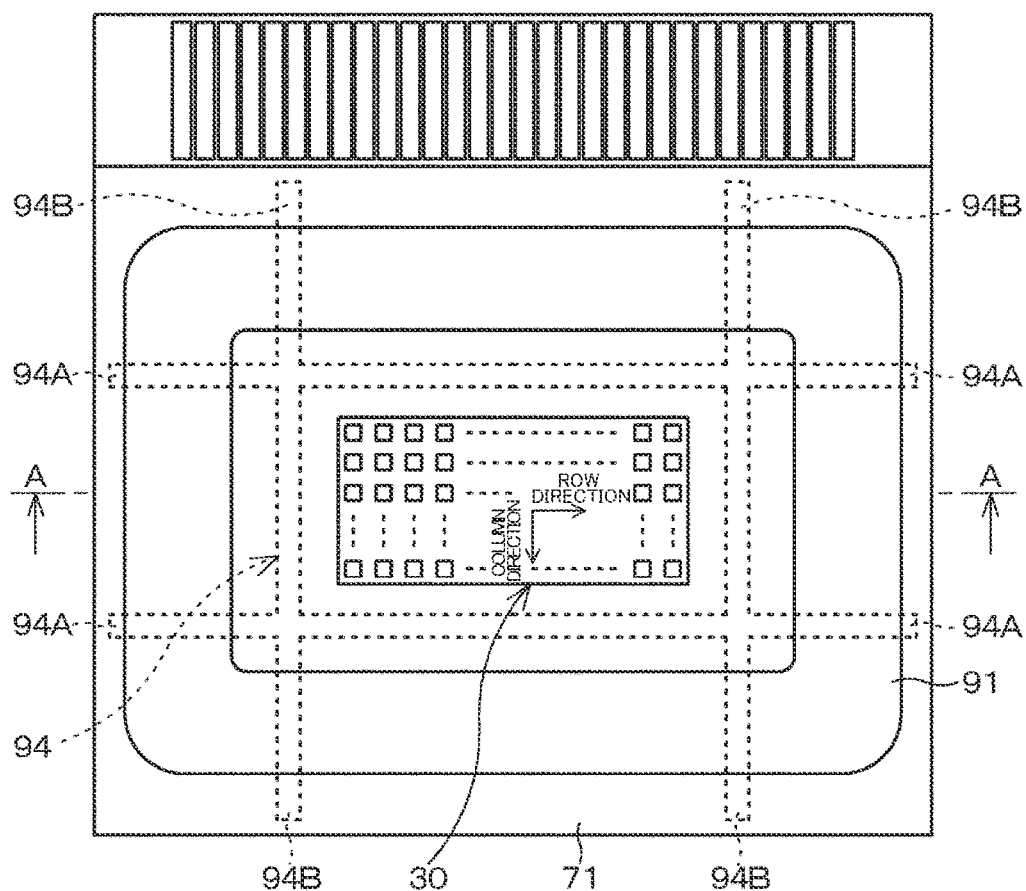
Fig. 5B
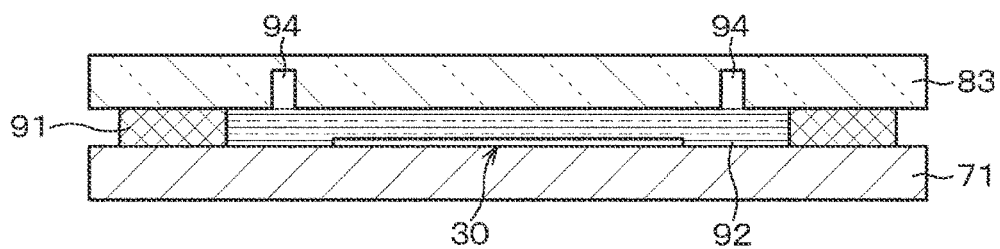

Fig. 14
Fig.14A
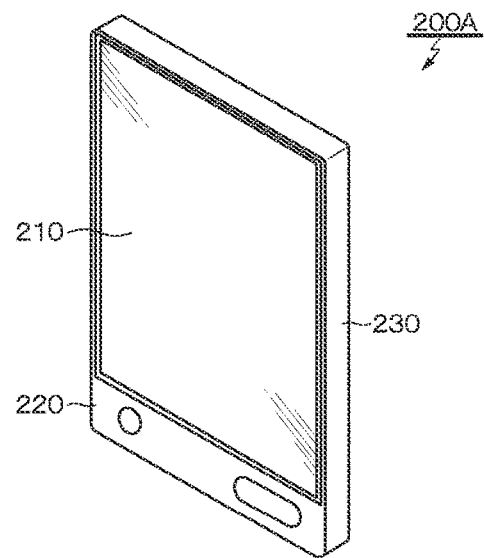
Fig.14B
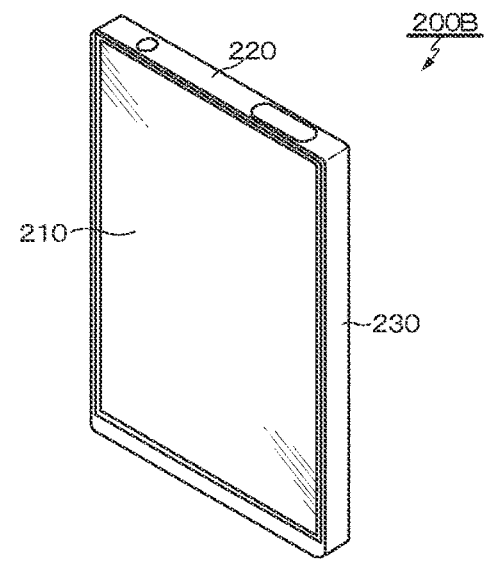

Fig. 16
Fig.16A
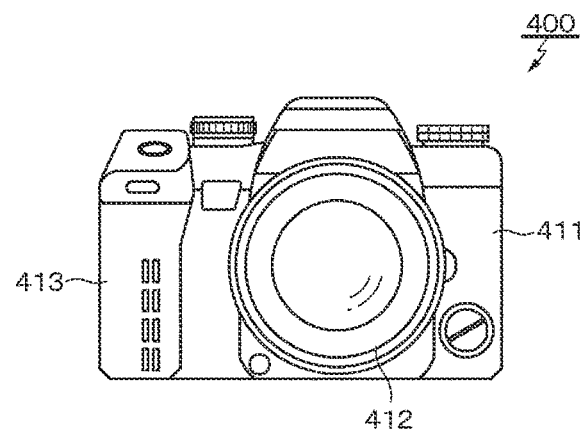
Fig.16B
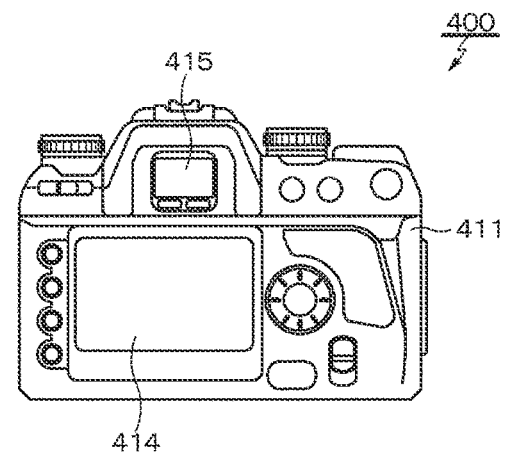

DISPLAY DEVICE AND ELECTRONIC APPARATUS INCLUDING SEAL PART OUTSIDE RECESS

TECHNICAL FIELD

The present disclosure relates to a display device and an electronic apparatus.

BACKGROUND ART

Recently, flat panel type (plane type) display devices have become mainstream. A flat panel type display device basically has a panel structure in which a substrate on which light-emitting units are formed and a substrate arranged facing the substrate are laminated.

In a display device having such a panel structure, a gap between the two laminated substrates needs to be stable in the areas of the light-emitting units in order to obtain high picture quality. Accordingly, in a conventional technique, a gap between two substrates is made constant by disposing spacers in a display area (in areas of light-emitting units) (refer to PTL 1, for example).

CITATION LIST

Patent Literature

PTL 1

JP 2005-294057 A

SUMMARY

Technical Problem

In the aforementioned conventional technique disclosed in PTL 1, a gap is made constant by disposing spacers in a display area, but there is a problem of luminous efficiency reduction due to the presence of the spacers in the display area.

Accordingly, an object of the present disclosure is to provide a display device in which a gap between two substrates is able to be made constant without providing spacers in a display area, and an electronic apparatus including the display device.

Solution to Problem

To accomplish the aforementioned object, a display device of the present disclosure includes a first substrate on which light-emitting units are formed, a second substrate disposed to face the first substrate, and a seal part which bonds the first substrate and the second substrate. In addition, at least one of the first substrate and the second substrate includes a recess formed at a portion outside an area of the light-emitting units, and the seal part is formed outside the recess.

Furthermore, to accomplish the aforementioned object, an electronic apparatus of the present disclosure has the display device including the first substrate, the second substrate, and the seal part in the aforementioned configuration as a display unit (display device).

BRIEF DESCRIPTION OF DRAWINGS

FIG. 4A and FIG. 4B are diagrams for describing a case in which a gap difference occurs in an area of light-emitting units due to a ratio of a cell volume to the volume of a sealant.

FIG. 5A is a schematic plan view illustrating a panel structure of a display panel according to example 1 and FIG. 5B is a cross-sectional view taken along line A-A of FIG. 5A in an arrow direction.

FIG. 14A is an external view illustrating a first example of a smartphone according to specific example 1 of an electronic apparatus of the present disclosure and FIG. 14B is an external view illustrating a second example of the smartphone.

FIG. 16A is a front view of a digital still camera according to specific example 3 of an electronic apparatus of the present disclosure and FIG. 16B is a rear view of the digital still camera.

DESCRIPTION OF EMBODIMENTS

Figure 1:
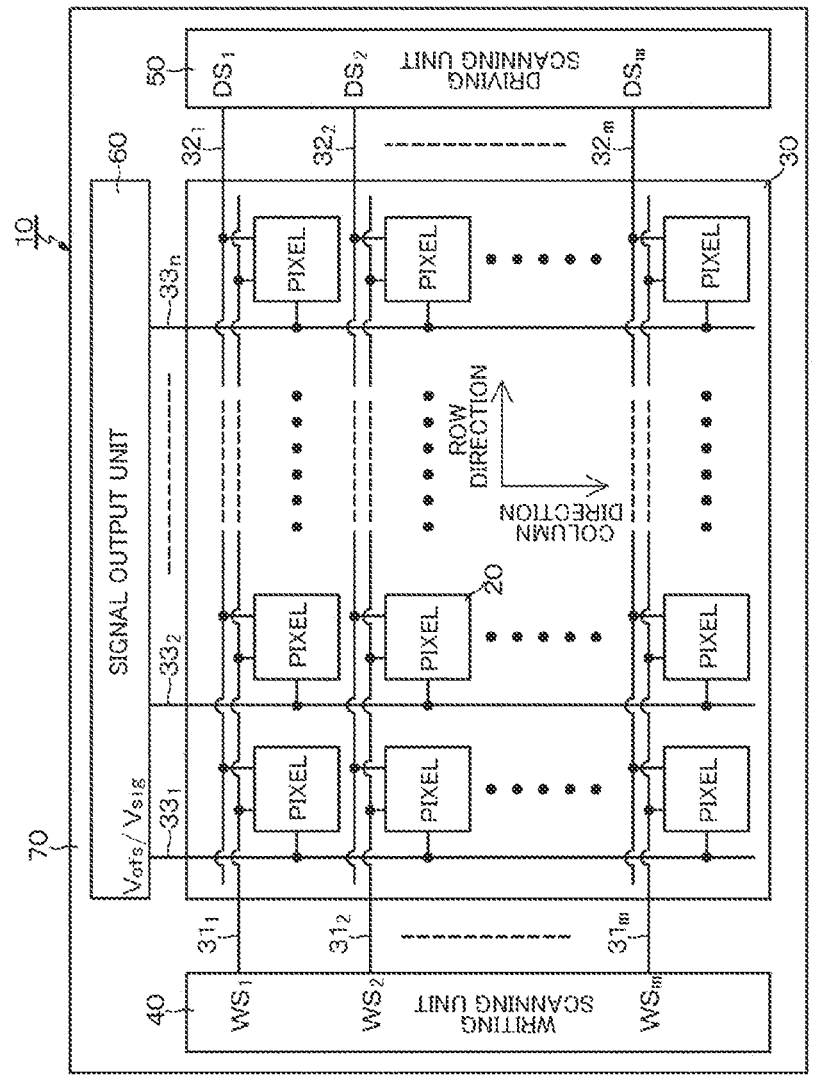
FIG. 1 is a system configuration diagram schematically illustrating a fundamental configuration of a display device to which technology of the present disclosure is applied.

Hereinafter, forms for embodying the technology of the present disclosure (hereinafter referred to as "embodiments") will be described in detail using drawings. The technology of the present disclosure is not limited to these embodiments. In the following description, the same signs are used for the same elements or elements having the same function and redundant description thereof is omitted. Meanwhile, description is performed in the following order.

1. General description of display device and electronic apparatus of present disclosure
2. Active matrix type display device to which technology of present disclosure is applied
   2-1. System configuration
   2-2. Pixel circuit
   2-3. Fundamental pixel structure
3. Embodiments of present disclosure
   3-1. Example 1 (example of basic form of recess formed outside area of light-emitting units)
   3-2. Example 2 (modified example of example 1: example in which part of the recess extends to edge of substrate)
   3-3. Example 3 (modified example of example 1: example in which a plurality of parts of the recess are provided around light-emitting units)

3-4. Example 4 (modified example of example 3: example in which a plurality of parts of the recess are formed inside the rectangular ring-shaped recess)

3-5. Example 5 (modified example of example 3: example in which a plurality of slot-shaped recesses are provided around light-emitting units)

3-6. Example 6 (modified example of example 1: example in which two recesses are formed around an area of light-emitting units in a row direction)

3-7. Example 7 (modified example of example 1: example in which one recess is formed around an area of light-emitting units in a row direction)

3-8. Example 8 (example in which recesses are formed in hook shape at portions corresponding to the corners of the seal part)

3-9. Example 9 (example in which recesses are formed to cross two sides of a corner of a seal part)

4. Modified examples

5. Electronic apparatus of present disclosure 5-1. Specific example 1 (example of smartphone)

5-2. Specific example 2 (example of head mounted display)

5-3. Specific example 3 (example of digital still camera)

6. Configurations that can be taken by present disclosure

General Description of Display Device and Electronic Apparatus of Present Disclosure In a display device and an electronic apparatus of the present disclosure, a configuration in which a substrate having a recess is a second substrate can be employed. In addition, when the recess is formed in a rectangular ring shape in a plan view around the area of a light-emitting unit and a seal part is formed in a rectangular ring shape in a plan view outside the recess, a configuration in which a part of the recess is formed to intersect the seal part in a plan view can be employed.

In the display device and the electronic apparatus of the present disclosure including the above-described desirable configurations, a configuration in which a part of the recess has a length exceeding the width of the seal part can be employed and, additionally, a configuration in which the part of the recess extends to the edge of a substrate can be employed.

In addition, in the display device and the electronic apparatus of the present disclosure including the above-described desirable configurations, a configuration in which a plurality of parts of the recess are formed along each side of the rectangular ring-shaped seal part can be employed. Here, a configuration in which a plurality of parts of the recess are formed outside or inside the rectangular ring-shaped recess can be employed.

Alternatively, in the display device and the electronic apparatus of the present disclosure including the above-described desirable configurations, a configuration in which the recess is composed of a plurality of slot-shaped recesses formed on the rectangular ring-shaped seal part along the seal part, or at least one recess is formed in a state in which it intersects the seal part in a plan view in a row direction of arrangement of light-emitting units in a matrix form can be employed.

Alternatively, in the display device and the electronic apparatus of the present disclosure including the above-described desirable configurations, when the seal part is formed in a rectangular ring shape in a plan view, a configuration in which the recess is formed in a hook shape at a portion corresponding to a corner of the rectangular ring-shaped seal part or formed in a state in which it crosses two sides of the corner can be employed.

In the display device and the electronic apparatus of the present disclosure including the above-described desirable configurations, a configuration in which the display device is an organic EL display device in which a plurality of subpixels have light-emitting units (light-emitting elements) composed of organic electroluminescence (EL) elements using EL of an organic material can be employed. That is, in the organic EL display device, a subpixel is configured as an organic EL element. An organic EL element is a so-called current driving type electro-optic device having an emission luminance varying in response to a current value flowing through the device.

The organic EL display device can be used, for example, as a monitor device constituting personal computers, video cameras, and digital still cameras and as a monitor device embedded in television receivers, cellular phones, personal digital assistants (PDAs), and game machines. Alternatively, the organic EL display device can be applied to an electronic view finder (EVF) or a head mounted display (HMD). Alternatively, lighting devices including a backlight device and a planar light source device for liquid crystal display devices can be additionally conceived.

In the organic EL element, an organic layer that is a light-emitting function layer includes a light-emitting layer (e.g., a light-emitting layer formed of an organic light-emitting material). Specifically, this organic layer can be composed of a laminated structure of a hole transport layer, a light-emitting layer, and an electron transport layer, a laminated structure of a hole transport layer and a light-emitting layer also serving as an electron transport layer, a laminated structure of a hole injection layer, a hole transport layer, a light-emitting layer, an electron transport layer, and an electron injection layer, or the like, for example. Further, when these laminated structures and the like are used as tandem units, the organic layer may have a 2-stage tandem structure in which a first tandem unit, a connection layer, and a second tandem unit are laminated or a 3-stage or more tandem structure in which three or more tandem units are laminated. In such a case, it is possible to obtain an organic layer that emits white light as a whole by changing a luminescent color to red, green and blue in each tandem unit.

As a method of forming an organic layer, a physical vapor deposition method (PVD method) such as vacuum evaporation, a printing method such as screen printing and inkjet printing, a laser transfer method of separating an organic layer on a laser absorption layer and transferring the organic layer by radiating a laser beam to a laminated structure of the laser absorption layer and the organic layer formed on a transfer substrate, and various coating methods can be exemplified. When an organic layer is formed on the basis of vacuum, evaporation, for example, the organic layer can be obtained by using a so-called metal mask and depositing a material that has passed through an opening formed in the metal mask, and the organic layer may be formed on the overall surface without being patterned.

Display Device to which Technology of Present Disclosure is Applied

The display device of the present disclosure is an active matrix type display device that controls current flowing through electro-optic elements by active elements provided in the same pixel circuits as those of the electro-optic elements, for example, insulated gate type field effect transistors. As an insulated gate type field effect transistor, typically, a metal oxide semiconductor (MOS) transistor or a thin film transistor (TFT) can be exemplified.

Here, an active matrix type organic EL display device using an organic EL element that is an example of a current driving type electro-optic element as a light-emitting unit (light-emitting element) of a pixel circuit is exemplified as the display device of the present disclosure. There are cases in which a "pixel circuit" is simply referred to as a "pixel" in the following.

System Configuration

FIG. 1 is a system configuration diagram schematically illustrating a fundamental configuration of an active matrix type organic EL display device that is a display device to which the technology of the present disclosure is applied.

As illustrated in FIG. 1, the active matrix type organic EL display device 10 to which the technology of the present disclosure is applied includes a pixel array 30 in which a plurality of pixels 20 including organic EL elements are two-dimensionally arranged in a matrix form, and a peripheral circuit (peripheral driver) disposed in a peripheral area of the pixel array 30.

The peripheral circuit of the pixel area may include, for example, a writing scanning unit 40, a driving scanning unit 50, a signal output unit 60, and the like mounted on the same display panel 70 as the pixel array 30 and drives each pixel 20 of the pixel array 30. Meanwhile, a configuration in which some or all of the writing scanning unit 40, the driving scanning unit 50, and the signal output unit 60 are provided outside the display panel 70 may be employed.

As a substrate of the display panel 70, an insulating transparent substrate such as a glass substrate can be used and a semiconductor substrate such as a silicon substrate can also be used. An organic EL display device using a semiconductor substrate such as a silicon substrate as the substrate of the display panel 70 is called a so-called micro display (small-sized display) and is suitable for being used as an electronic view finder of a digital still camera, a display unit of a head mounted display, and the like.

The organic EL display device 10 can be configured to cope with monochrome (black and white) display or color display. When the organic EL display device 10 copes with color display, one pixel (unit pixel/pixel) that is a unit forming a color image is composed of a plurality of subpixels. Here, each subpixel corresponds to the pixel 20 of FIG. 1. More specifically, in a display device that copes with color display, one pixel may include, for example, three subpixels: a subpixel emitting red (R) light; a subpixel emitting green (G) light; and a subpixel emitting blue (B) light.

However, one pixel is not limited to a combination of subpixels including R, G and B subpixels of three primary colors, and one pixel may be configured by adding a subpixel of one color or subpixels of a plurality of colors to the subpixels of three primary colors. More specifically, one pixel may be configured by adding a subpixel emitting white (W) light in order to improve luminance or one pixel may be configured by adding at least one subpixel emitting complementary color light in order to extend a color reproduction range, for example.

In the pixel array 30, scan lines 31 ($31_1$ to $31_m$) and driving lines 32 ($32_1$ to $32_m$) are wired for each pixel row in a first direction (row direction/horizontal direction) with respect to an arrangement of pixels 20 in m rows and n columns. Further, signal lines 33 ($31_1$ to $33_n$) are wired for each pixel column in a second direction (column direction/vertical direction) with respect to the arrangement of the pixels 20 in m rows and n columns.

The scan lines $31_1$ to $31_m$ are connected to output terminals of corresponding rows of the writing scanning unit 40. The driving lines $32_1$ to $32_m$ are connected to output terminals of corresponding rows of the driving scanning unit 50. The signal lines $33_1$ to $33_n$ are connected to output terminals of corresponding columns of the signal output unit 60.

The writing scanning unit 40 is configured by a shift register circuit or the like. This writing scanning unit 40 performs so-called line sequential scanning of sequentially scanning the respective pixels 20 of the pixel array 30 in units of a row by sequentially supplying writing scan signals WS ($WS_1$ to $WS_m$) to the scan lines 31 ($31_1$ to $31_m$) when a signal voltage of a video signal is written to each pixel 20 of the pixel array 30.

Like the writing scanning unit 40, the driving scanning unit 50 is configured by a shift register circuit or the like. This driving scanning unit 50 controls emission/non-emission (extinction) of the pixels 20 by supplying light emission control signals DS ($DS_1$ to $DS_m$) to the driving lines 32 ($32_1$ to $32_m$) in synchronization with line sequential scanning of the writing scanning unit 40.

The signal output unit 60 selectively outputs a signal voltage $V_{sig}$ of a video signal (which may be simply referred to as a "signal voltage" hereinafter) according to luminance information and a reference voltage $V_{ofs}$ supplied from a signal supply source (not shown). Here, the reference voltage $V_{ofs}$ is a voltage corresponding to a reference voltage of the signal voltage $V_{sig}$ of the video signal (e.g., a voltage corresponding to a black level of the video signal) or a voltage near the voltage. The reference voltage $V_{ofs}$ is used as an initialization voltage when a correction operation is performed.

The signal voltage $V_{sig}$/reference voltage $V_{ofs}$ selectively output from the signal output unit 60 is written to each pixel 20 of the pixel array 30 through the signal lines 33 ($33_1$ to $33_m$) in units of a pixel row selected by line sequential scanning of the writing scanning unit 40. That is, the signal output unit 60 employs a line sequential writing driving form in which the signal voltage $V_{sig}$ is written in units of a pixel row (line).

Pixel Circuit

Figure 2:
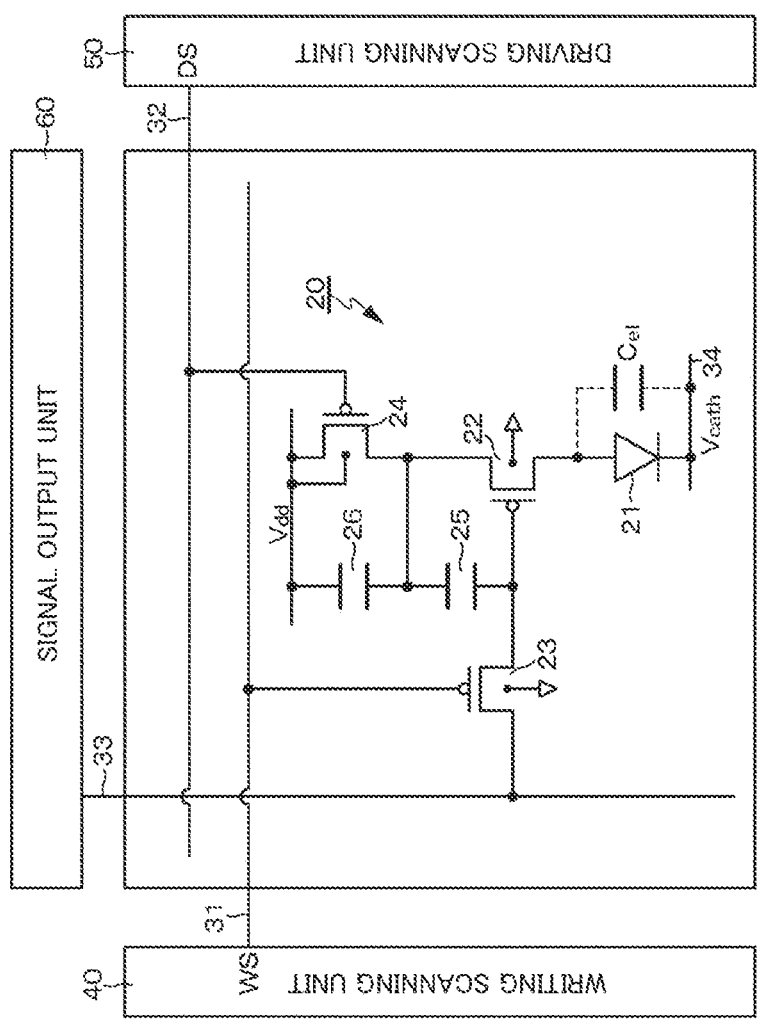
FIG. 2 is a circuit diagram illustrating a circuit configuration of a unit pixel (pixel circuit).

FIG. 2 is a circuit diagram illustrating an example of a circuit configuration of a pixel (pixel circuit) in the active matrix type organic EL display device 10. A light-emitting unit of the pixel 20 includes an organic EL element 21. The organic EL element 21 is an example of a current driving type electro-optic device having an emission luminance varying in response to a current value flowing through the device.

As illustrated in FIG. 2, the pixel 20 includes the organic EL element 21 and a driving circuit (pixel driving circuit) that drives the organic EL element 21 by flowing current through the organic EL element 21. The organic EL element 21 has a cathode electrode connected to a common power line 34 commonly wired for all pixels 20. In the figure, $C_{el}$ is an equivalent capacitor of the organic EL element 21.

The driving circuit that drives the organic EL element 21 includes a driving transistor 22, a sampling transistor 28, a light emission control transistor 24, a storage capacitor 25, and an auxiliary capacitor 26. Here, it is assumed that the organic EL element 21 and the driving circuit thereof are formed on a semiconductor such as silicon instead of an insulator such as glass, and a configuration in which a P-channel type transistor is used as the driving transistor 22 is employed.

In addition, this example employs a configuration in which a P-channel type transistor is also used as the sampling transistor 23 and the light emission control transistor 24 like the driving transistor 22. Accordingly, the driving transistor 22, the sampling transistor 23, and the light emission control transistor 24 have four terminals of source/gate/drain/back gate instead of three terminals of source/gate/drain. A power source voltage Void is applied to the back gates.

However, the sampling transistor 23 and the light emission control transistor 24 are not limited to the P-channel type transistor because they are switching transistors serving as switching elements. Accordingly, the sampling transistor 23 and the light emission control transistor 24 may be N-channel type transistors or components in which a P-channel type and an N-channel type are mixed.

In the pixel 20 having the aforementioned configuration, the sampling transistor 23 writes the signal voltage $V_{sig}$ of the video signal supplied from the signal output unit 60 through the signal lines 33 to the storage capacitor 25 by sampling the signal voltage $V_{sig}$. The light emission control transistor 24 is connected between a node of the power source voltage $V_{dd}$ and the source electrode of the driving transistor 22 and controls emission/non-emission of the organic. EL element 21 through driving according to the light emission control signal DS.

The storage capacitor 25 is connected between the gate electrode and the source electrode of the driving transistor 22. This storage capacitor 25 stores the signal voltage $V_{sig}$ of the video signal written by sampling of the sampling transistor 23. The driving transistor 22 drives the organic EL element 21 by flowing a driving current in response to a storage voltage of the storage capacitor 25 through the organic EL element 21.

The auxiliary capacitor 26 is connected between the source electrode of the driving transistor 22 and a node of a fixed electric potential, for example, the node of the power source voltage V. This auxiliary capacitor 26 curbs changing of a source potential of the driving transistor 22 when the signal voltage $V_{sig}$ of the video signal has been written and makes a gate-source voltage $V_{gs}$ of the driving transistor 22 become a threshold voltage $V_{th}$ of the driving transistor 22.

Fundamental Pixel Structure

In the organic EL display device 10 having the aforementioned configuration, the structure of the display panel 70 (panel structure) on which the pixel array 30, the peripheral circuit thereof, and the like are formed is basically a structure in which a first substrate on which light-emitting units are formed and a second substrate disposed facing the first substrate are bonded. Hereinafter, the first substrate will be described as a supporting substrate and the second substrate be described as an opposite substrate.

As a panel structure of the display panel 70, a so-called top emission type panel structure in which light is emitted from a side facing the supporting substrate and a so-called bottom emission type panel structure in which light is emitted from the supporting substrate exist. The technology of the present disclosure can be applied to both the top emission type panel structure and the bottom emission type panel structure.

Figure 3:
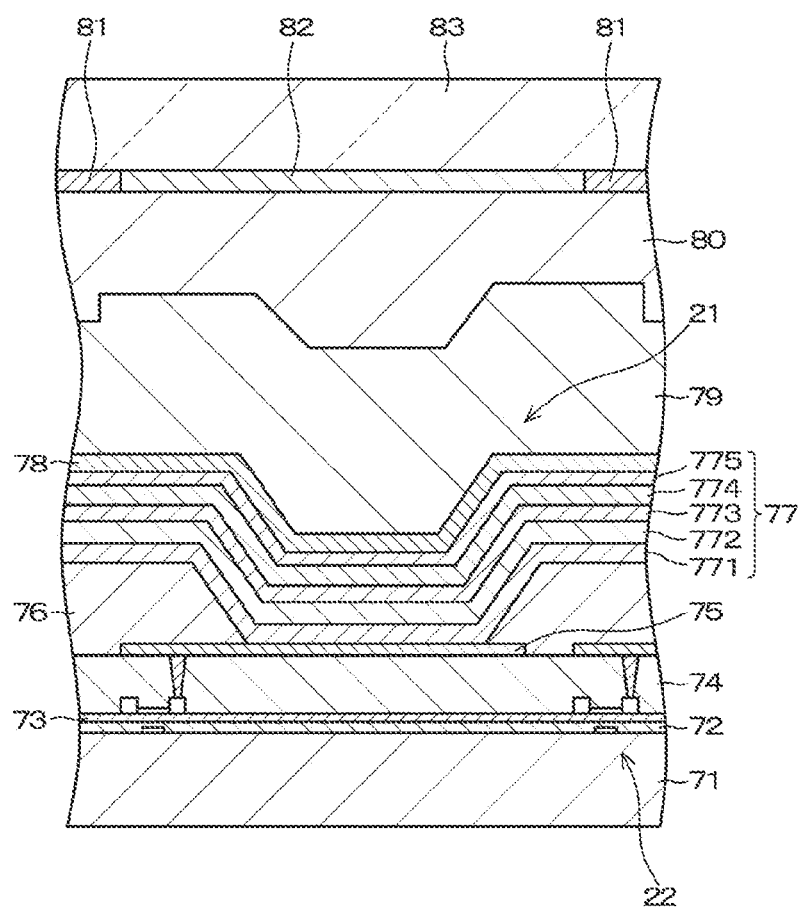
FIG. 3 is a cross-sectional view illustrating an example of a panel structure of one pixel of a display panel.

Hereinafter, the panel structure of the display panel 70 will be described in detail using FIG. 3. FIG. 3 is a cross-sectional view illustrating an example of a panel structure of one pixel of the display panel 70. The panel structure of the display panel 70 exemplified here may be, for example, a top emission type panel structure in which light of any of R (red), G (green) and B (blue) is projected from the upper surface of the panel (surface facing a supporting substrate 71) according to a combination of a white organic EL element emitting white light and a color filter.

The area on the supporting substrate 71 includes an effective pixel area (display area) in which a plurality of pixels 20 are arranged in a matrix form and a peripheral area positioned at the periphery (outer edge/circumference) of the effective pixel area. The pixel driving circuit including the driving transistor 22, the sampling transistor 23, the light emission control transistor 24, the storage capacitor 25, and the auxiliary capacitor 26 is provided in the effective pixel area. The peripheral circuit including the writing scanning unit 40, the driving scanning unit 50, the signal output unit 60, and the like is provided in the peripheral area. In addition, a circuit layer 72 including these circuits is formed on the substrate 71.

The display panel 70 has a laminated structure in which, for example, an inorganic insulating layer 73, an underlying insulating layer 74, an anode electrode 75, an organic insulating layer 76, an organic layer 77, a cathode electrode 78, an organic passivation layer 79, a filler layer (adhesive layer) 80, and a black matrix layer 81 are sequentially laminated on the circuit layer 72. Meanwhile, a color filter 82 is provided in units of a pixel at the same level as the black matrix layer 81. In addition, an opposite substrate 83 is bonded onto this laminated structure and the laminated structure is sealed by the opposite substrate 83.

In the panel structure having the aforementioned configuration, the anode electrode 75, the organic layer 77, and the cathode electrode 78 form a laminated structure constituting the organic EL element 21 emitting white light. The anode electrode 75 is provided as an independent electrode for a pixel 20 of each color in the effective pixel area. The cathode electrode 78 is a transparent electrode and is provided as a common electrode in each pixel 20 in the effective pixel area.

The organic layer 77 has a laminated structure in which a hole injection layer 771, a hole transport layer 772, a light-emitting layer 773, an electron transport layer 774, and an electron injection layer 775 are sequentially laminated from the side of the anode electrode 75. Among these layers, layers other than the light-emitting layer 773 may be provided as necessary.

The hole injection layer 771 is provided in order to improve hole injection efficiency and prevent leakage. The hole transport layer 772 is for improving the efficiency of hole transport to the light-emitting layer 773. The light-emitting layer 773 generates light according to recombination of electrons and holes occurring due to electric field applied thereto. The electron transport layer 774 is for improving the efficiency of electron transport to the light-emitting layer 773. The electron injection layer 775 is for improving electron injection efficiency.

As described above, the organic EL display device 10 has a configuration in which the underlying insulating layer 74 is provided to cover the circuit part (the pixel driving circuit, the peripheral circuit, and the like) formed on the supporting substrate 71 and the organic EL element 21 is formed on the underlying insulating layer 74. In addition, the anode electrode 75 is provided in units of a pixel under the organic EL element 21 as a lower electrode, and the cathode electrode 78 is provided commonly for all pixels on the organic EL element 21 as an upper electrode.

Then, the supporting substrate 71 that is the first substrate and the opposite substrate 83 that is the second substrate are bonded to constitute the display panel 70. More specifically, as will be described later, the display panel 70 has a panel structure in which the supporting substrate 71 and the opposite substrate 83 are bonded by a seal part outside the area of the light-emitting units (pixel array 30) and a sealant is filled into an area including the light-emitting units surrounded by the seal part.

In the organic EL display device 10 having this panel structure, a gap between the supporting substrate 71 and the opposite substrate 83 needs to be stable in the area of the light-emitting units in order to obtain high picture quality. In this panel structure, there are cases in which a gap difference occurs in the area of the light-emitting units according to a ratio of the area of the area of the light-emitting units (hereinafter referred to as a "cell volume") surrounded by the seal part to the volume of the sealant filled into the area.

Here, a case in which a gap difference occurs in the area of the light-emitting units according to the ratio of the cell volume to the volume of the sealant will be described in detail using FIG. 4A and FIG. 4B. When the sealant 92 has been filled into the area including the light-emitting units surrounded by the seal part 91, swelling of the opposite substrate 83 occurs in a convex shape, as illustrated in FIG. 4A, when the volume of the sealant 92 is greater than the cell volume. On the other hand, when the volume of the sealant 92 is less than the cell volume, a void 93 in a gas bubble shape is generated in the area including the light-emitting units (pixel array 30), as illustrated in FIG. 4B. In this regard, it is very important to strictly control the relationship between the cell volume and the volume of the sealant 92.

EMBODIMENTS OF PRESENT DISCLOSURE

In an embodiment of the present disclosure, in the display panel 70 having the supporting substrate 71 and the opposite substrate 83 bonded, a recess is formed at a portion outside the area of the light-emitting units (pixel array 30) on at least one of the supporting substrate 71 and the opposite substrate 83 and a seal part is formed outside the recess in order to strictly control the relationship between the cell volume and the volume of the sealant 92.

Since wiring and the like are formed on the supporting substrate 71, it is desirable that one substrate on which the recess is formed be the opposite substrate 83. In addition, preferably, a configuration in which the seal part is formed in a rectangular ring shape around the area of the light-emitting units (pixel array 30) and a part of the recess intersects the seal part and has a length exceeding the width of the seal part can be employed. However, the ring shape of the seal part is not limited to a rectangular shape. Further, the recess is not limited to the configuration in which a part; thereof intersects the seal part or the configuration in which the part thereof has a length exceeding the width of the seal part.

As described above, it is possible to make a gap between the supporting substrate 71 and the opposite substrate 83 uniform over the entire area of the light-emitting units without; providing spacers in the display area by forming the recess at a portion outside the area of the light-emitting units on at least one of the supporting substrate 71 and the opposite substrate 83 and forming the seal part outside the recess in the display panel 70.

Specifically, it is possible to strictly control the relationship between the cell volume and the volume of the sealant because excess filled sealant can be caused to flow into the recess by forming the recess at a portion outside the area of the light-emitting units. Accordingly, it is possible to promote formation of a uniform gap between the supporting substrate 71 and the opposite substrate 83 over the entire area of the light-emitting units. In addition, in a case where a void in a gas bubble shape is generated in the area of the light-emitting units at the time of sealing, the recess can also serve as a bubble-removing part into which the void in a gas bubble shape flows.

In this manner, formation of a uniform gap between the supporting substrate 71 and the opposite substrate 83 can be promoted according to operation of the recess, and the recess can also serve as a bubble-removing part. Accordingly, since it is possible to promote formation of a uniform gap between the supporting substrate 71 and the opposite substrate 83 without providing spacers and the like in the display area, high picture quality can be provided without a reduction in emission efficiency caused by presence of spacers and the like. Hereinafter, specific examples of the embodiment of the present disclosure will be described.

EXAMPLE 1

Example 1 is an example of a basic form of a recess formed at a portion outside the area of the light-emitting units (pixel array 30). A schematic plan view of a panel structure of the display panel 70 according to example 1 is illustrated in FIG. 5A and a cross-sectional view taken along line A-A of FIG. 5A indicated by arrows is illustrated in FIG. 5B.

The supporting substrate 71 is a silicon substrate, a glass substrate, a quartz substrate, a plastic substrate, or the like. On the inner side of the supporting substrate 71, the pixel array 30 in which light-emitting units (organic EL elements 21) are two-dimensionally arranged in a matrix form, and although not illustrated, the driving circuit of the light-emitting units and a wiring part for electrically connecting the light-emitting units and the driving circuit are provided.

Further, the opposite substrate 83 (which is not illustrated in FIG. 5A) is formed of a transparent material such as quartz, glass, plastics, or the like. On the opposite substrate 83, a recess 94 in a rectangular ring shape having rounded corners in a plan view, for example, is formed in a region outside the pixel array 30. The recess 94 can be formed through etching or dicing. Meanwhile, the recess 94 formed on the opposite substrate 83 is illustrated using a dotted line in FIG. 5A. The same applies to each embodiment which will be described later.

The supporting substrate 71 and the opposite substrate 83 are bonded through a seal part 91 that is formed of a sealing material in a rectangular ring shape in a plan view in the same manner outside the recess 94. Then, a sealant 92 is filled into a cell formed by the supporting substrate 71, the opposite substrate 83, and the seal part 91. After filling of the sealant 92, the sealant 92 is completely cured through UV radiation or heating.

As a method of filling the sealant 92, an inlet method or a one drop fill (ODF) method may be used. The inlet method is a method of filling the sealant 92 through an inlet formed at the seal part 91 after bonding of the supporting substrate 71 and the opposite substrate 83. The ODF method is a method of dropping the sealant 92 onto the supporting substrate 71 or the opposite substrate 83 before bonding of the supporting substrate 71 and the opposite substrate 83 and then bonding the supporting substrate 71 and the opposite substrate 83.

In this manner, the recess 94 is formed in a region between the pixel array 30 and the seal part 91 on the opposite substrate 83, for example, in a rectangular ring shape in a plan view. The rectangular ring-shaped recess 94 includes extending parts 94A and 94B extending in the row direction and the column direction of the pixel array 30 at four corners. The extending parts 94A and 94B that are parts of the recess 94 are formed to intersect the seal part 91 in a plan view and have a length exceeding the width of the seal part 91.

As described above, according to the panel structure of the display panel 70 according to example 1, since the recess 94 is formed at a portion outside the pixel array 30 oil the opposite substrate 83, for example, the excess flied sealant 92 can be caused to flow into the recess 94 and thus the relationship between the cell volume and the volume of the sealant can be strictly controller.

In particular, the recess 94 has a great effect of causing the excess filled sealant 92 to flow thereinto because the recess 94 has the extending parts 94A and 94B having a length exceeding the width of the seal part 91 at four corners of the rectangular ring shape. Meanwhile, although the extending parts 94A and 94B that intersect the seal part 91 in a plan view are provided at four corners of the rectangular ring shape in the present example, the positions of the extending parts 94A and 94B are not limited to the four corners.

In this manner, it is possible to make the gap between the supporting substrate 71 and the opposite substrate 83 uniform over the entire area of the light-emitting units by strictly controlling the relationship between the cell volume and the volume of the sealant according to the operation of the recess 94. In addition, when the void 93 in a gas bubble shape (refer to FIG. 4B) is generated in the area of the pixel array 30 at the time of sealing, the recess 94 can also serve as a bubble-removing part into which the void 93 in a gas bubble shape flows. As a result, high picture quality can be provided.

EXAMPLE 2

Figure 6:
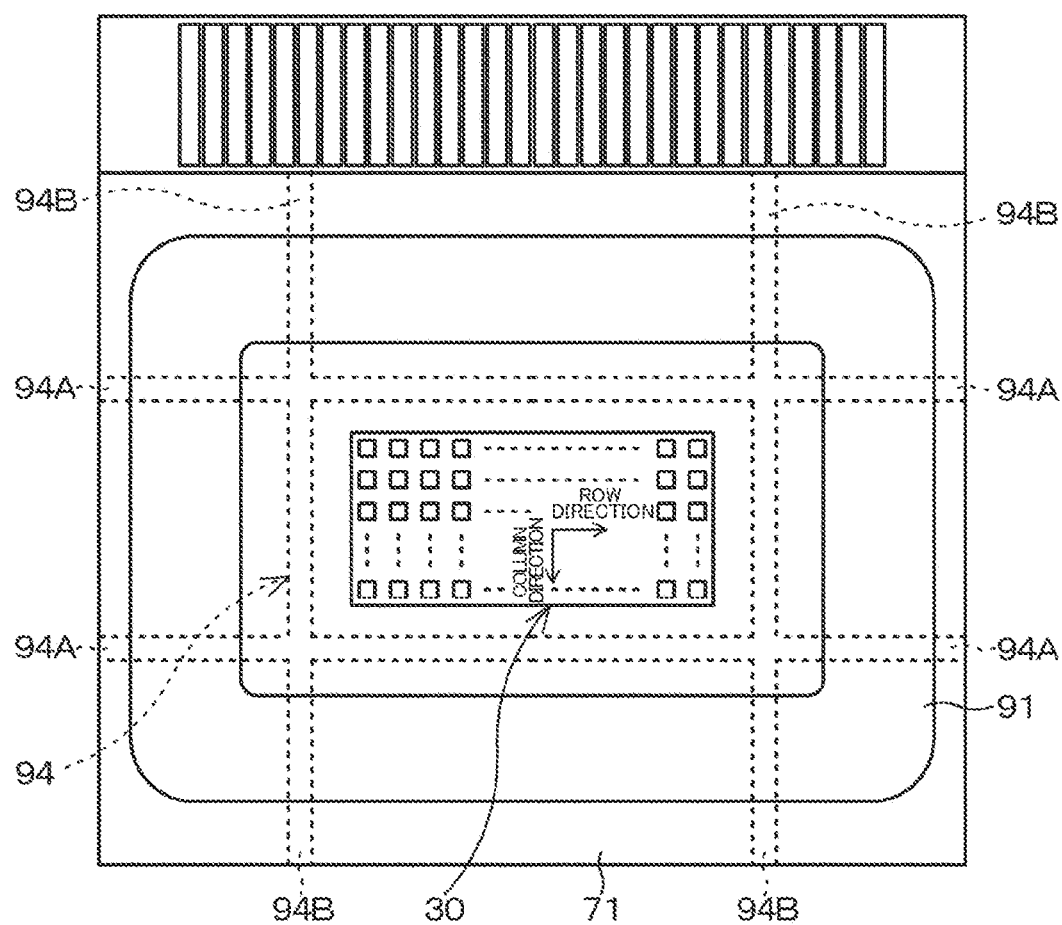
FIG. 6 is a schematic plan view illustrating a panel structure of a display panel according to example 2.

Example 2 is a modified example of example 1 in which parts of a recess extend to the edge of a substrate. A schematic plan view of a panel structure of the display panel 70 according to example 2 is illustrated in FIG. 6.

The panel structure of the display panel 70 according to example 2 employs a configuration in which the extending parts 94A and 94B that are parts of the recess 94 extend to the edge of the opposite substrate 83 (refer to FIG. 5B) in the panel structure of the display panel 70 according to example 1. In this manner, since parts of the recess 94 extend to the edge of the substrate, the advantage that the recess 94 can be simultaneously processed for a plurality of chips when the recess 94 is processed through dicing, for example, is obtained in addition to the same operation and effect as those of example 1.

EXAMPLE 3

Figure 7:
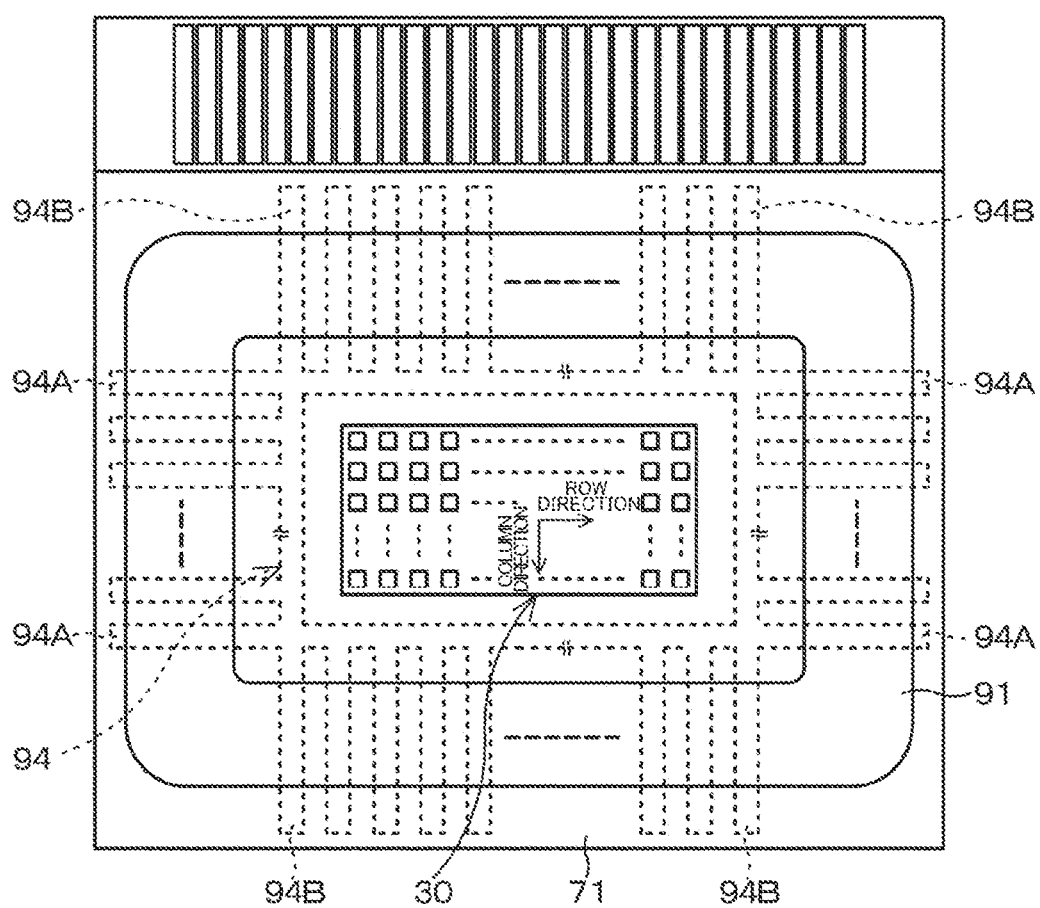
FIG. 7 is a schematic plan view illustrating a panel structure of a display panel according to example 3.

Example 3 is a modified example of example 1 in which a plurality of parts of a recess are provided around an area including light-emitting units (pixel array 30). A schematic plan view of a panel structure of the display panel 70 according to example 3 is illustrated in FIG. 7.

The panel structure of the display panel 70 according to example 3 employs a configuration in which a plurality of extending parts 94A of the recess 94 are provided on the left and right of the pixel array 30 and a plurality of extending parts 94B of the recess 94 are provided above and under the pixel array 30 in the panel structure of the display panel 70 according to example 1. That is, the plurality of extending parts 94A and the plurality of extending parts 94B of the recess 94 are provided along the respective sides of the rectangular ring-shaped seal part 91 outside the rectangular ring-shaped recess 94. The plurality of extending parts 94A and the plurality of extending parts 94B are formed to intersect the seal part 91 in a plan view and have a length exceeding the width of the seal part 91.

In this manner, it is possible to cause the sealant 92 or gas bubbles (the void 93 in a gas bubble shape) to flow into the recess 94 with high efficiency by providing the plurality of extending parts 94A and the plurality of extending parts 94B of the recess 94 along the respective sides of the rectangular ring-shaped seal part 91 around the pixel array 30, and thus higher picture quality can be provided.

EXAMPLE 4

Figure 8:
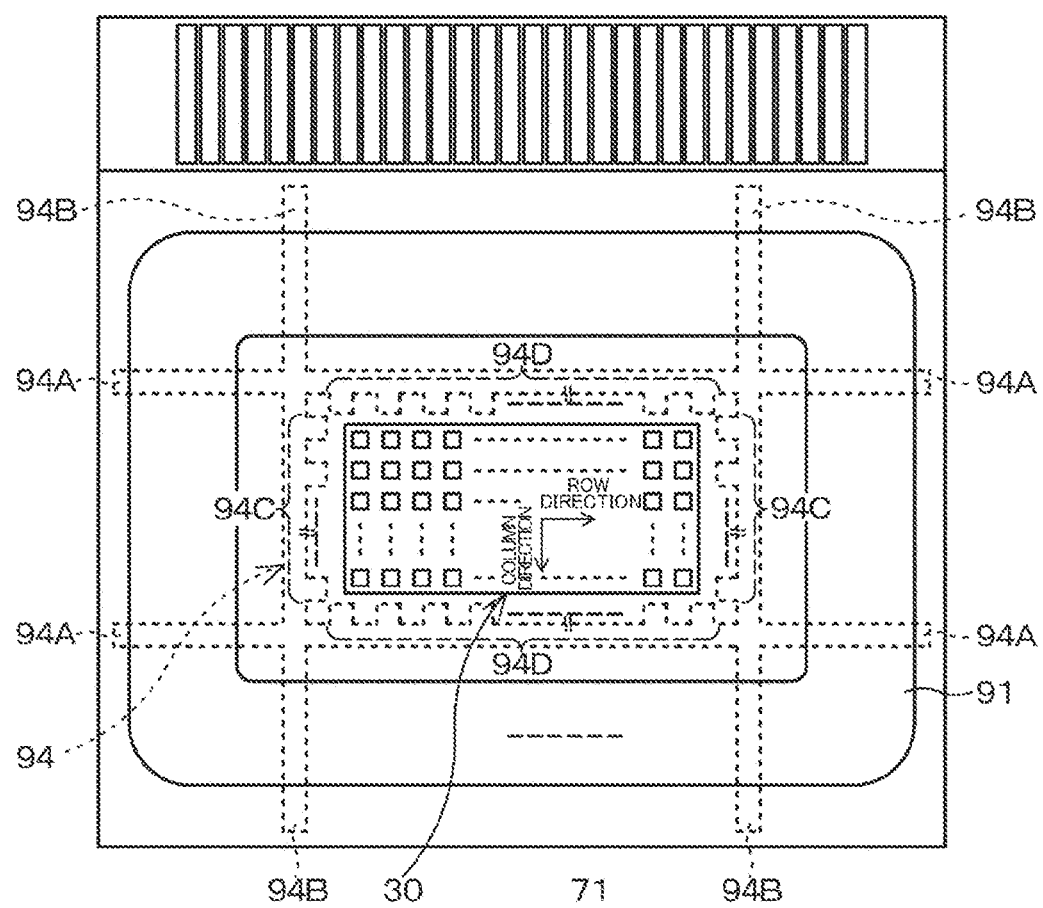
FIG. 8 is a schematic plan view illustrating a panel structure of a display panel according to example 4.

Example 4 is a modified example of example 3 in which a plurality of parts of a recess are provided inside the rectangular ring-shaped recess 94 in a plan view. A schematic plan view of a panel structure of the display panel 70 according to example 4 is illustrated in FIG. 8.

The panel structure of the display panel 70 according to example 3 employs a configuration in which all the plurality of extending parts 94A and the plurality of extending parts 94B are formed to intersect the seal part 91 in a plan view outside the rectangular ring-shaped recess 94 in a plan view. On the other hand, the panel structure of the display panel 70 according to example 4 employs a configuration in which a plurality of extending parts 94C and a plurality of extending parts 94D are formed inside the rectangular ring-shaped recess 94 except the extending parts 94A and the extending parts 94B at the corners of the rectangular ring-shaped recess 94.

In this manner, even when the plurality of extending parts 94C and the plurality of extending parts 94D are formed inside the rectangular ring-shaped recess 94 in a plan view, the sealant 92 or gas bubbles (the void 93 in a gas bubble shape) can be caused to flow into the recess 94 with high efficiency as in the case of example 3, and thus higher picture quality can be provided.

EXAMPLE 5

Figure 9:
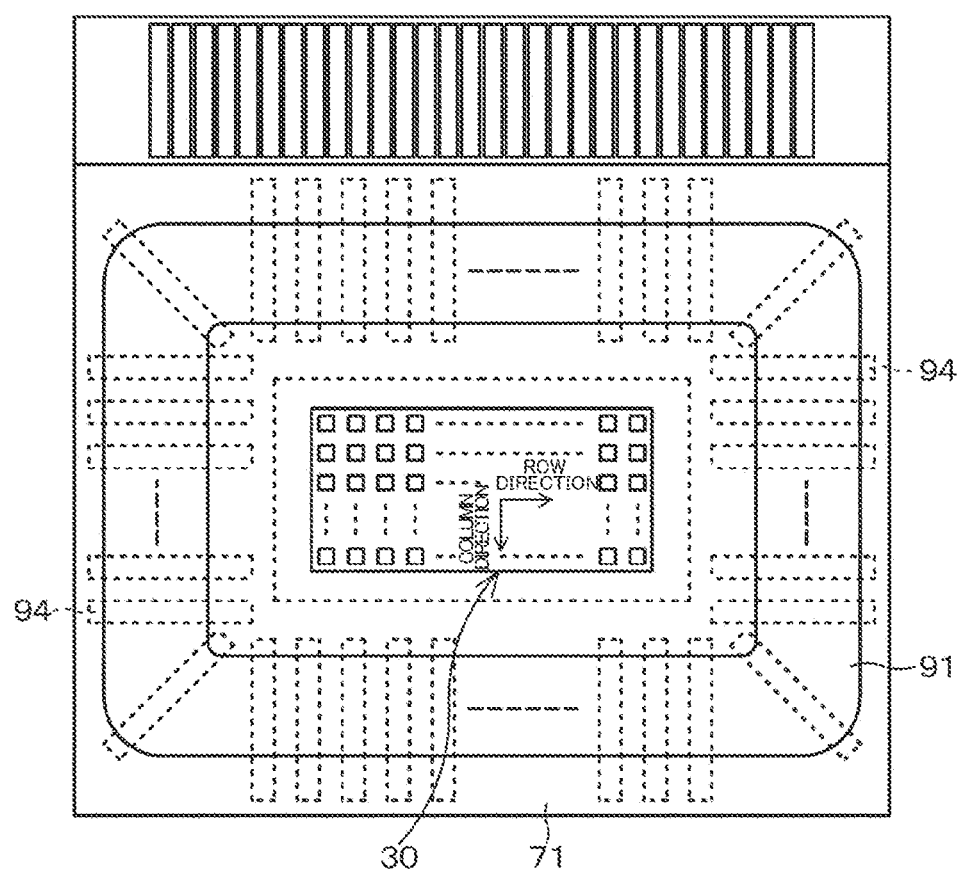
FIG. 9 is a schematic plan view illustrating a panel structure of a display panel according to example 5.

Example 5 is a modified example of example 3 in which a plurality of slot-shaped recesses corresponding to the extending parts 94A and the extending parts 94B are provided around the area of the light-emitting units (pixel array 30). A schematic plan view of a panel structure of the display panel 70 according to example 5 is illustrated in FIG. 9.

The panel structure of the display panel 70 according to example 5 employs a configuration in which a plurality of slot-shaped recesses 94 corresponding to the plurality of extending parts 94A and the plurality of extending parts 94B in the panel structure of the display panel 70 according to example 3 are provided around the area of the light-emitting units (pixel array 30). Specifically, the plurality of slot-shaped recesses 94 are formed on the rectangular ring-shaped seal part 91 along the seal part 91, are formed to intersect the seal part 91 in a plan view as in the case of example 3, and have a length exceeding the width of the seal part 91. Recesses 94 corresponding to the corners of the seal part 91 are radially formed with respect to the seal part 91. Accordingly, the plurality of recesses 94 are configured to be arranged in a rectangular ring shape in a plan view such that they surround the area of the light-emitting units as a whole.

In this manner, even when the plurality of slot-shaped recesses 94 are provided around the area of the light-emitting units, the sealant 92 or gas bubbles (the void 93 in a gas bubble shape) can be caused to flow into the plurality of recesses 94 arranged in a rectangular ring shape in a plan view with high efficiency as in the case of example 3, and thus higher picture quality can be provided.

EXAMPLE 6

Figure 10:
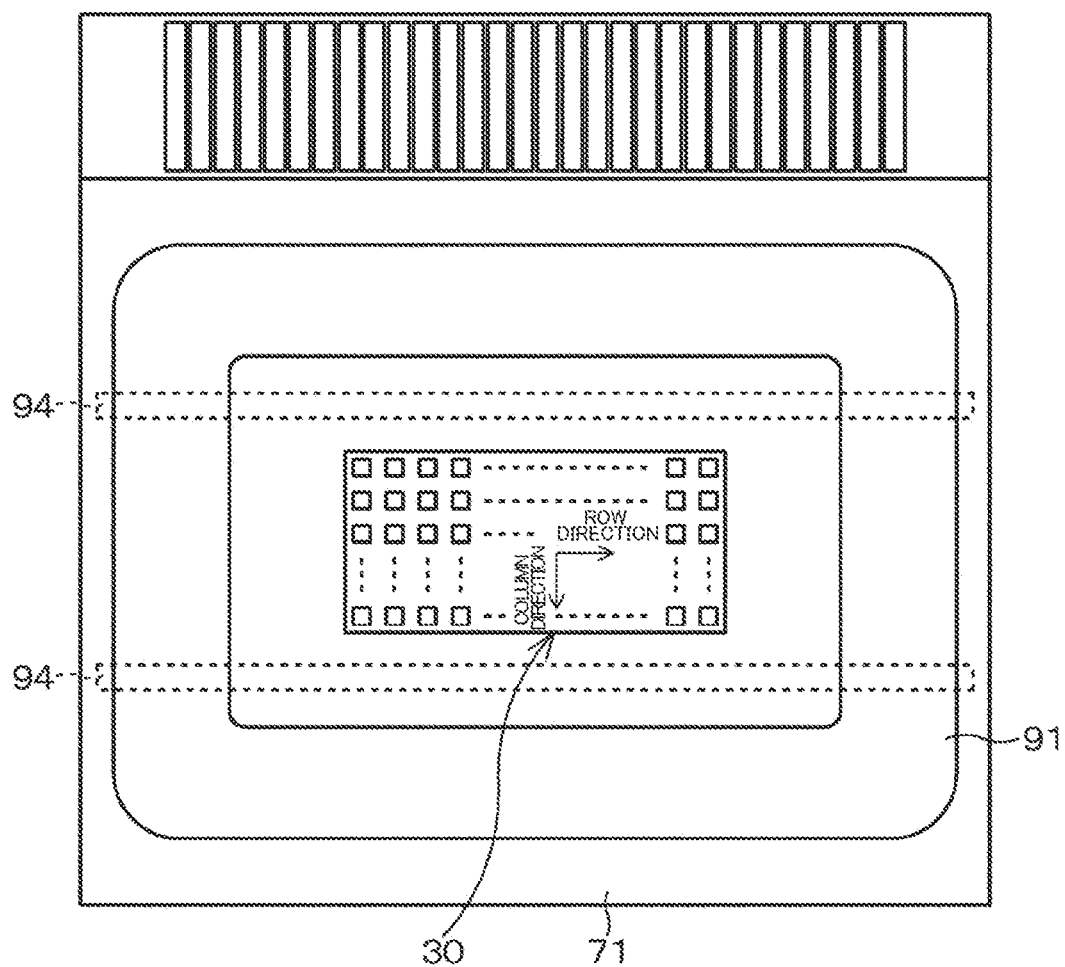
FIG. 10 is a schematic plan view illustrating a panel structure of a display panel according to example 6.

Example 6 is a modified example of example 1 in which two recesses are formed around the area of the light-emitting units in the row direction. A schematic plan view of a panel structure of the display panel 70 according to example 6 is illustrated in FIG. 10.

The panel structure of the display panel 70 according to example 6 employs a configuration in which two recesses 94 are formed around the pixel array 30 (the area of the light-emitting units), more specifically, above and under the pixel array 30 in the row direction of the pixel array 30. The two recesses 94 are provided in a region between the pixel array 30 and the seal part 91 above and under the pixel array 30 and formed to intersect the seal part 91 in a plan view. In addition, the intersections of the two recesses 94 and the seal part 91 have a length exceeding the width of the seal part 91.

In this manner, even in the panel structure in which the recesses 94 are formed in the row direction in the region between the pixel array 30 and the seal part 91, it is possible to cause the excess filled sealant 92 to flow into the recesses 94 and make the gap between the supporting substrate 71 and the opposite substrate 83 uniform over the entire area of the light-emitting units, and thus higher picture quality can be provided. Furthermore, the advantage of easily processing the recesses 94 is obtained because the recesses 94 are simply formed in the row direction.

Moreover, in the panel structure of the display panel 70 according to example 6, a configuration in which the two recesses 94 are extended to the edge of the opposite substrate 83 (refer to FIG. 5B) as in the case of the panel structure of the display panel 70 according to example 2 can be employed. When this configuration is employed, the advantage that the recesses 94 can be simultaneously processed for a plurality of chips when the recesses 94 are processed through dicing, for example, is obtained as in the case of example 2.

EXAMPLE 7

Figure 11:
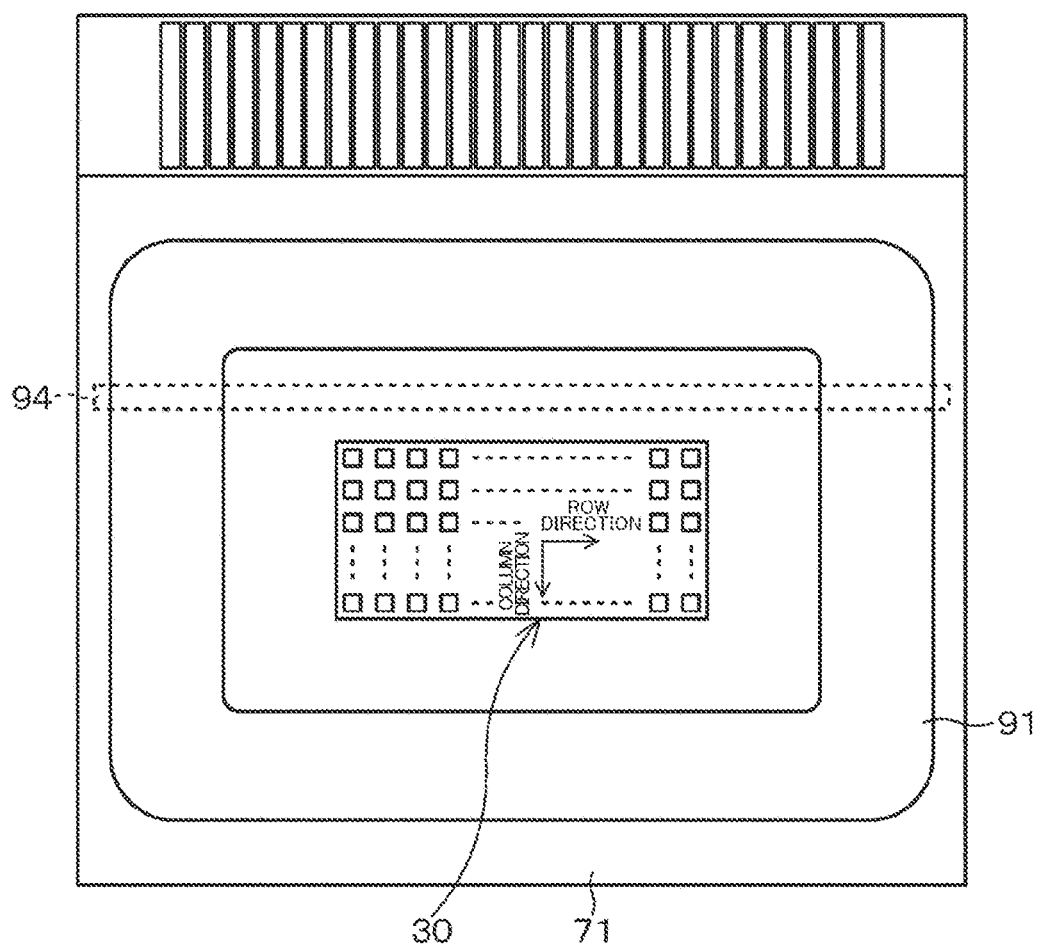
FIG. 11 is a schematic plan view illustrating a panel structure of a display panel according to example 7.

Example 7 is a modified example of example 1 in which one recess is formed around the area of the light-emitting units in the row direction. A schematic plan view of a panel structure of the display panel 70 according to example 7 is illustrated in FIG. 11.

The panel structure of the display panel 70 according to example 7 employs a configuration in which one recess 94 is formed around the pixel array 30 (the area of the light-emitting units), more specifically, above (or under) the pixel array 30 in the row direction of the pixel array 30. The one recess 94 is provided in a region between the pixel array 30 and the seal part 91 and formed to intersect the seal part 91 in a plan view. In addition, the intersections of the one recess 94 and the seal part 91 have a length exceeding the width of the seal part 91.

According to the panel structure of the display panel 70 according to example 7, although the effect of causing the sealant 92 to flow into the recess 94 is less than that in the panel structure of the display panel 70 according to example 6 because the number of recesses 94 is small, the same operation and effect as those of the case of embodiment 6 can be basically obtained. Further, even in the panel structure of the display panel 70 according to example 7, the technology of example 2 in which the recess 94 is extended to the edge of the substrate can be applied.

EXAMPLE 8

Figure 12:
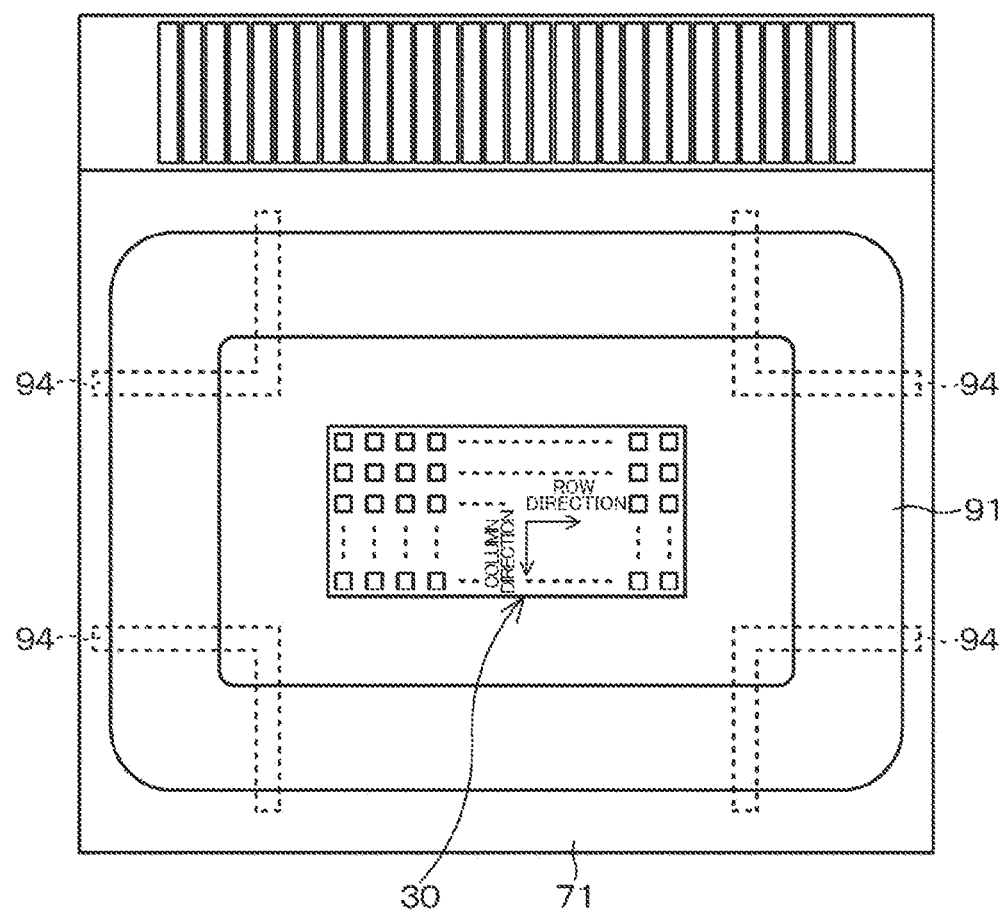
FIG. 12 is a schematic plan view illustrating a panel structure of a display panel according to example 8.

Example 8 is an example in which recesses are formed in a hook shape at portions corresponding to the corners of the rectangular ring-shaped seal part. A schematic plan view of a panel structure of the display panel 70 according to example 8 is illustrated in FIG. 12.

The panel structure of the display panel 70 according to example 8 employs a configuration in which recesses 94 are formed in a hook shape (L shape/inverted L shape) at portions corresponding to the corners of the rectangular ring-shaped seal part 91. In the hook-shaped recesses 94, bent hook parts are positioned in a region between the pixel array 30 and the seal part 91 and other extending parts are formed to intersect the seal part 91 in a plan view and have a length exceeding the width of the seal part 91.

In this manner, according to the configuration in which the hook-shaped recesses 94 are formed at portions corresponding to the corners of the rectangular ring-shaped seal part 91, particularly, the void 93 (refer to FIG. 4B) in a gas bubble shape generated at corners of the region between the pixel array 30 and the seal part 91 can be caused to flow into the recesses 94, and thus picture quality deterioration caused by the void 93 in a gas bubble shape can be prevented. However, the hook-shaped recesses 94 also have a function of causing the excess filled sealant 92 to flow thereinto as well as the function of a bubble-removing part. Meanwhile, although a case in which the hook-shaped recesses 94 are formed at the four corners of the seal part 91 is exemplified here, the position of the hook-shaped recesses 94 are not limited to the four corners.

EXAMPLE 9

Figure 13:
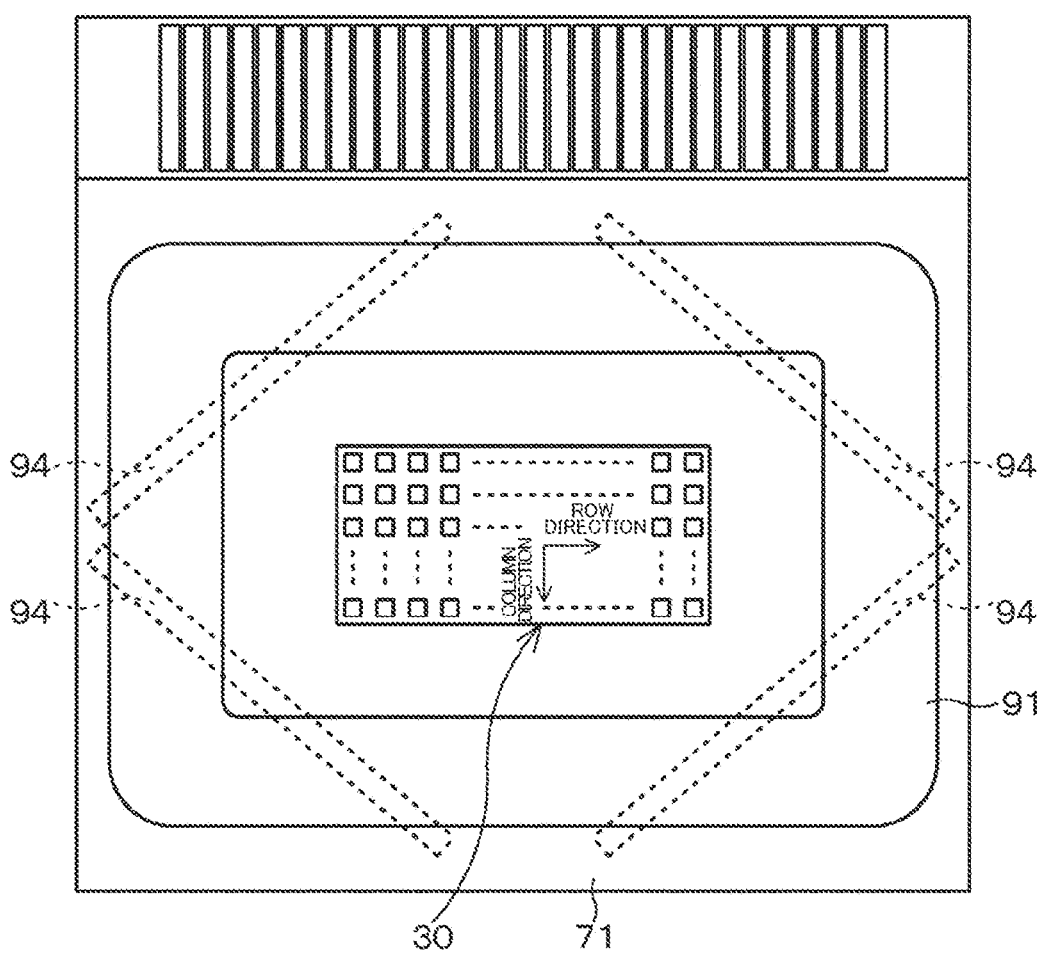
FIG. 13 is a schematic plan view illustrating a panel structure of a display panel according to example 9.

Example 9 is an example in which recesses are formed to cross two sides of a corner of a rectangular ring-shaped seal part. A schematic plan view of a panel structure of the display panel 70 according to embodiment 9 is illustrated in FIG. 13.

The panel structure of the display panel 70 according to example 9 employs a configuration in which recesses 94 are formed to cross two sides of a corner of the rectangular ring-shaped seal part 91. In the crossed recesses 94 formed in this manner, middle parts thereof are positioned in the region between the pixel array 30 and the seal part 91 and other parts are formed to intersect the seal part 91 in a plan view and have a length exceeding the width of the seal part 91.

In this manner, according to the configuration in which the recesses 94 are formed at portions of the corner of the rectangular ring-shaped seal part 91 to cross two sides of each corner, particularly, the void 93 in a gas bubble shape generated at corners of the region between the pixel array 30 and the seal part 91 can be caused to flow into the recesses 94 as in the case of example 8, and thus picture quality deterioration caused by the void 93 in a gas bubble shape can be prevented. However, the crossed recesses 94 also have a function of causing the excess filled sealant 92 to flow thereinto as well as the function of a bubble-removing part. Meanwhile, although a case in which the crossed recesses 94 are formed at the four corners of the seal part 91 is exemplified here, the position of the crossed recesses 94 are not limited to the four corners.

MODIFIED EXAMPLES

Although the technology of the present disclosure has been described above on the basis of desirable embodiments, the technology of the present disclosure is not limited to the embodiments. The configurations and structures of the display device described in the aforementioned embodiments are exemplary and can be appropriately modified. For example, although the technology of the present disclosure has been described by taking an organic EL device (display panel) for example in the aforementioned embodiments, the technology of the present disclosure can be applied to display devices other than the organic EL device, specifically, all display devices having a panel structure in which a first substrate and a second substrate are bonded using a sealing material.

In addition, although the recess 94 having the function of causing the excess filled sealant 92 to flow thereinto and the function of the bubble-removing part is formed on the opposite substrate 83 that is the second substrate in the aforementioned embodiments, the recess 94 can also be formed on the supporting substrate 71 that is the first substrate. However, it is desirable that the substrate on which the recess 94 is formed be the opposite substrate 83 because wiring and the like are formed on the supporting substrate 71.

Furthermore, although example 1 to example 9 are exemplified as examples of shapes of the recess 94 in the aforementioned embodiments, shapes of the recess 94 are not limited to these examples of shapes and the recess 94 can have any shape as long as the recess 94 can cause the excess filled sealant 92 or the void 93 in a gas bubble shape (refer to FIG. 4B) to flow thereinto.

Electronic Apparatus of Present Disclosure

The above-described display device of the present disclosure can be used as a display unit (display device) of electronic apparatuses of every field which display video signals input thereto or video signals generated therein as images or videos. As electronic apparatuses, portable terminal devices such as television sets, notebook type personal computers, digital still cameras, and cellular phones, head mounted displays, and the like can be exemplified. However, the electronic apparatuses are not limited thereto.

According to the technology of the present disclosure, it is possible to provide high picture quality according to a uniform gap between two substrates. In addition, it is possible to provide display images with high picture quality by using the display device of the present disclosure as a display unit (display device) of electronic apparatuses of every field.

As specific examples of an electronic apparatus using the display device of the present disclosure, a smartphone, a head mounted display, and a digital still camera will be exemplified below. However, the specific examples exemplified here are merely examples and the electronic apparatus is not limited to these specific examples.

SPECIFIC EXAMPLE 1: EXAMPLE OF SMARTPHONE

External views of a smartphone according to specific example 1 of the electronic apparatus of the present disclosure are illustrated in FIG. 14. FIG. 14A is an external view illustrating a first example of the smartphone and FIG. 14B is an external view illustrating a second example of the smartphone.

The smartphone 100A of the first example and the smartphone 100B of the second example include a display unit 110 and an operation unit 120. In the case of the smartphone 100A of the first example, the operation unit 120 is provided at a lower part of the display unit 110 of a housing 130. In the case of the smartphone 100B of the second example, the operation unit 120 is provided at the top surface of the housing 130. In addition, the display device of the present disclosure can be used as the display unit 110 of the smartphones 100A and 100A. That is, the smartphones 100A and 100B according to present specific example 1 are manufactured using the display device of the present disclosure as the display unit 110 thereof.

SPECIFIC EXAMPLE 2: EXAMPLE OF HEAD MOUNTED DISPLAY

Figure 15:
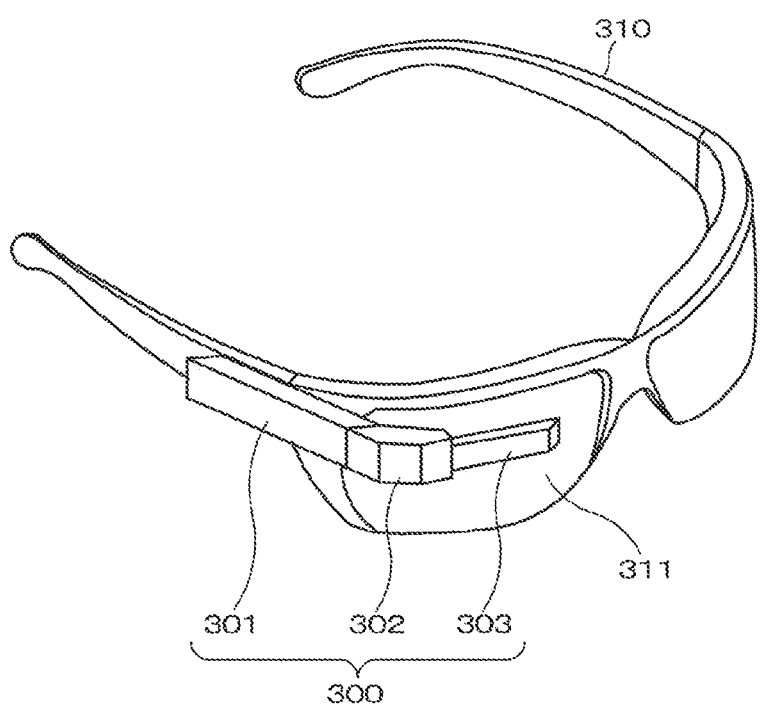
FIG. 15 is an external view illustrating a head mounted display according to specific example 2 of an electronic apparatus of the present disclosure.

An external view of a head mounted display according to specific example 2 of the electronic apparatus of the present disclosure are illustrated in FIG. 15.

The head mounted display 200 according to specific example 2 is configured as a transmission type head mounted display including a main body 201, an arm 202, and a lens barrel 203. The main body 201 is connected to the arm 202 and eyeglasses 210. Specifically, the end of the main body 201 in a long-side direction is attached to the arm 202. In addition, one side of the side of the main body 201 is connected to the eyeglasses 210 through a connection member (not illustrated). Meanwhile, the main body 201 may be directly put on the head of a human body.

The main body 201 has a control substrate for controlling the operation of the head mounted display 200 and a display unit embedded therein. The arm 202 supports the lens barrel 203 with respect to the main body 201 by connecting the main body 201 and the lens barrel 203. Specifically, the arm 202 fixes the lens barrel 203 to the main body 201 by connecting an end of the main body 201 to an end of the lens barrel 203. In addition, the arm 202 has a signal line for communicating data with respect to images provided from the main body 201 to the lens barrel 203, which is embedded therein.

The lens barrel 203 projects image light provided from the main body 201 through the arm 202 to the eyes of a user wearing the head mounted display 200 through a lens 211 of the eyeglasses 210. In this head mounted display 200, the display device of the present disclosure can be used as the display unit embedded in the main body 201. That is, the head mounted display 200 according to present specific example 2 is manufactured using the display device of the present disclosure as the display unit thereof.

SPECIFIC EXAMPLE 3: EXAMPLE OF DIGITAL STILL CAMERA

External views of a lens exchangeable single lens reflex type digital still camera according to specific example 3 of the electronic apparatus of the present disclosure are illustrated in FIG. 16. FIG. 16A is a front view of the digital still camera and FIG. 16B is a rear view of the digital still camera.

The lens exchangeable single lens reflex type digital still camera 300 includes an exchangeable photographing lens unit (exchangeable lens) 312 provided on the right side of the front side of a camera main body (camera body) 311, and a gripping portion 313 for being gripped by a photographer, which is provided on the left of the front side. In addition, a monitor 314 is provided at an approximately center of the rear side of the camera main body 311. A view finder (eyepiece window) 315 is provided above the monitor 314. The photographer can visually recognize an optical image of a subject guided by the photographing lens unit 312 and determine a composition by looking into the view finder 315.

In the lens exchangeable single lens reflex type digital still camera 300 having the aforementioned configuration, the display device of the present disclosure can be used as the view finder 315. That is, the lens exchangeable single lens reflex type digital still camera 300 according to present specific example 3 is manufactured using the display device of the present disclosure as the view finder 315 thereof.

Configurations that can be Taken by Present Disclosure

Meanwhile, the present disclose can take the following configurations.

A. Display Device

[A-1] A display device including:
a first substrate on which light-emitting units are formed;
a second substrate disposed to face the first substrate; and
a seal part which bonds the first substrate and the second substrate, wherein
at least one of the first substrate and the second substrate has a recess formed at a portion outside an area of the light-emitting units, and
the seal part is formed outside the recess.
[A-2] The display device according to [A-1], wherein
one substrate is the second substrate.
[A-3] The display device according to [A-1] or [A-2], wherein
the recess is formed in a rectangular ring shape in a plan view around an area of the light-emitting units,
the seal part is formed in a rectangular ring shape in a plan view outside the recess, and
a part of the recess is formed to intersect the seal part in a plan view.
[A-4] The display device according to [A-3], wherein
the part of the recess has a length exceeding a width of the seal part.
[A-5] The display device according to [A-4], wherein
the part of the recess extends to an edge of a substrate.
[A-6] The display device according to [A-3], wherein
a plurality of parts of the recess are formed along respective sides of the rectangular ring-shaped seal part.
[A-7] The display device according to [A-6], wherein
the parts of the recess are formed outside the rectangular ring-shaped recess.
[A-8] The display device according to [A-6], wherein
the parts of the recess are formed inside the rectangular ring-shaped recess.
[A-9] The display device according to any one of [A-3] to [A-5], wherein
the recess is composed of a plurality of slot-shaped recesses formed on the rectangular ring-shaped seal part along the seal part.
[A-10] The display device according to [A-1] or [A-2], wherein
at least one recess is formed to intersect the seal part in a plan view in a row direction of an arrangement of the light-emitting units in a matrix form.
[A-11] The display device according to [A-1] or [A-2], wherein
the seal part is formed in a rectangular ring shape in a plan view, and
the recess is formed in a hook shape at portions corresponding to corners of the rectangular ring-shaped seal part.
[A-12] The display device according to [A-1] or [A-2], wherein
the seal part is formed in a rectangular ring shape in a plan view, and
the recess is formed at portions corresponding to corners of the rectangular ring-shaped seal part to cross two sides of each corner.
[A-13] The display device according to any one of [A-1] to [A-12], wherein
the light-emitting units are configured as organic electroluminescence elements.

B. Electronic Apparatus

[B-1] An electronic apparatus comprising a display device, the display device including:
a first substrate on which light-emitting units are formed;
a second substrate disposed to face the first substrate; and
a seal part which bonds the first substrate and the second substrate, wherein
at least one of the first substrate and the second substrate includes a recess formed at a portion outside an area of the light-emitting units, and
the seal part is formed outside the recess.
[B-2] The electronic apparatus according to [B-1], wherein
one substrate is the second substrate.
[B-3] The electronic apparatus according to [B-1] or [B-2], wherein
the recess is formed in a rectangular ring shape in a plan view around the area of the light-emitting units,
the seal part is formed in a rectangular ring shape in a plan view outside the recess, and
a part of the recess is formed to intersect the seal part in a plan view.
[B-4] The electronic apparatus according to [B-3], wherein
the part of the recess has a length exceeding a width of the seal part.
[B-5] The electronic apparatus according to [B-4], wherein
the part of the recess extends to an edge of a substrate.
[B-6] The electronic apparatus according to [B-3], wherein
a plurality of parts of the recess are formed along respective sides of the rectangular ring-shaped seal part.
[B-7] The electronic apparatus according to [B-6], wherein
the parts of the recess are formed outside the rectangular ring-shaped recess.

[B-8] The electronic apparatus according to [B-6], wherein
the parts of the recess are formed inside the rectangular ring-shaped recess.

[B-9] The electronic apparatus according to any one of [B-3] to [B-5], wherein
the recess is composed of a plurality of slot-shaped recesses formed on the rectangular ring-shaped seal part along the seal part.

[B-10] The electronic apparatus according to [B-1] or [B-2], wherein
at least one recess is formed to intersect the seal part in a plan view in a row direction of an arrangement of the light-emitting units in a matrix form.

[B-11] The electronic apparatus according to [B-1] or [B-2], wherein
the seal part is formed in a rectangular ring shape in a plan view, and the recess is formed in a hook shape at portions corresponding to corners of the rectangular ring-shaped seal part.

[B-12] The electronic apparatus according to [B-1] or [B-2], wherein
the seal part is formed in a rectangular ring shape in a plan view, and
the recess is formed at portions corresponding to corners of the rectangular ring-shaped seal part to cross two sides of each corner.

[B-13] The electronic apparatus according to any one of [B-1] to [B-12], wherein
the light-emitting units are configured as organic electroluminescence elements.

REFERENCE SIGNS LIST

Organic EL display device
20 Pixel
21 Organic EL element
22 Driving transistor
23 Sampling transistor
24 Light emission control transistor
25 Storage capacitor
26 Auxiliary capacitor
30 Pixel array
$31_1$-$31_m$ Scanning line
$32_1$-$32_m$ Driving line
$33_1$-$33_n$ Signal line
40 Writing scanning unit
50 Driving scanning unit
60 Signal output unit
70 Display panel
71 Supporting substrate (first substrate)
72 Circuit layer
73 Inorganic insulating layer
74 Underlying insulating layer
75 Anode electrode
76 Organic insulating layer
77 Organic layer
78 Cathode electrode
79 Organic passivation layer
80 Filler layer (adhesive layer)
81 Black matrix layer
82 Color filter
83 Opposite substrate (second substrate)
91 Seal part
92 Sealant
93 Void in gas bubble shape
94 Recess
94A, 94B Extending part of recess (part of recess)

The invention claimed is:

1. A display device comprising:
a first substrate on which light-emitting units are formed;
a second substrate disposed to face the first substrate; and
a seal part which bonds the first substrate and the second substrate, wherein
at least one of the first substrate and the second substrate has a recess formed at a portion outside an area of the light-emitting units,
the seal part is formed outside the recess,
the recess is formed in a rectangular ring shape in a plan view around an area of the light-emitting units, and
the seal part is formed in a rectangular ring shape in a plan view outside the recess, and a part of the recess is formed to intersect the seal part in a plan view.

2. The display device according to claim 1, wherein
one substrate is the second substrate.

3. The display device according to claim 1, wherein
the part of the recess has a length exceeding a width of the seal part.

4. The display device according to claim 3, wherein
the part of the recess extends to an edge of a substrate.

5. The display device according to claim 1, wherein
a plurality of parts of the recess are formed along respective sides of the rectangular ring-shaped seal part.

6. The display device according to claim 5, wherein
the parts of the recess are formed outside the rectangular ring-shaped recess.

7. The display device according to claim 5, wherein
the parts of the recess are formed inside the rectangular ring-shaped recess.

8. The display device according to claim 1, wherein
the recess is composed of a plurality of slot-shaped recesses formed on the rectangular ring-shaped seal part along the seal part.

9. The display device according to claim 1, wherein
the seal part is formed in a rectangular ring shape in a plan view, and
the recess is formed in a hook shape at portions corresponding to corners of the rectangular ring-shaped seal part.

10. The display device according to claim 1, wherein
the light-emitting units are configured as organic electroluminescence elements.

11. An electronic apparatus comprising a display device according to claim 1.

12. The electronic apparatus according to claim 11, wherein the part of the recess has a length exceeding a width of the seal part.

13. The electronic apparatus according to claim 12, wherein the part of the recess extends to an edge of a substrate.

14. The electronic apparatus according to claim 11, wherein a plurality of parts of the recess are formed along respective sides of the rectangular ring-shaped seal part.

15. The electronic apparatus according to claim 14, wherein the parts of the recess are formed outside the rectangular ring-shaped recess.

16. The electronic apparatus according to claim 14, wherein the parts of the recess are formed inside the rectangular ring-shaped recess.

17. A display device comprising:
a first substrate on which light-emitting units are formed;
a second substrate disposed to face the first substrate; and
a seal part which bonds the first substrate and the second substrate, wherein
at least one of the first substrate and the second substrate has a recess formed at a portion outside an area of the light-emitting units,
the seal part is formed outside the recess, and
the recess is formed to intersect the seal part in a plan view in a row direction of an arrangement of the light-emitting units in a matrix form.

18. An electronic apparatus comprising a display device according to claim 17.

19. A display device comprising:
a first substrate on which light-emitting units are formed;
a second substrate disposed to face the first substrate; and
a seal part which bonds the first substrate and the second substrate, wherein
at least one of the first substrate and the second substrate has a recess formed at a portion outside an area of the light-emitting units,
the seal part is formed outside the recess,
the seal part is formed in a rectangular ring shape in a plan view, and
the recess is formed at portions corresponding to corners of the rectangular ring-shaped seal part to cross two sides of each corner.

20. An electronic apparatus comprising a display device according to claim 19.

* * * * *